United States Patent [19]

Burke et al.

[11] Patent Number: 4,458,324
[45] Date of Patent: Jul. 3, 1984

[54] CHARGE DOMAIN MULTIPLYING DEVICE

[75] Inventors: Barry E. Burke, Lexington; Alice M. Chiang, Weston; William T. Lindley, all of Mass.

[73] Assignee: Massachusetts Institute of Technology, Cambridge, Mass.

[21] Appl. No.: 294,633

[22] Filed: Aug. 20, 1981

[51] Int. Cl.³ .................... G06J 1/00; G06G 7/16; H03K 13/02
[52] U.S. Cl. .................... 364/606; 357/24; 364/844; 364/862; 377/63; 340/347 DA
[58] Field of Search ............ 364/602, 606, 844, 862, 364/841; 340/347 DA, 347 AD, 347 M; 357/24; 377/57-63

[56] References Cited

U.S. PATENT DOCUMENTS

| 4,120,035 | 10/1978 | Cases et al. | 364/862 X |
| 4,126,852 | 11/1978 | Baertsch | 364/606 X |
| 4,156,923 | 5/1979 | Lampe et al. | 364/844 |
| 4,161,783 | 7/1979 | Wrench, Jr. et al. | 364/862 X |
| 4,316,258 | 2/1982 | Berger | 364/862 X |

OTHER PUBLICATIONS

"A Charge-Transfer Multiplying Digital-to-Analog Converter", Jose F. Albarran and David A. Hodges, IEEE Journal of Solid-State Circuits, vol. SC-11, No. 6, Dec. 1976, pp. 772-779.

"A Symmetrically Balanced Linear Differential Charge-Splitting Input for Charge-Coupled Devices:," Carlo H. Sequin, Michael F. Tompsett, David A. Sealer & Ronald E. Crochiere, IEEE Transactions on Electron Devices, vol. ED-24, No. 6, Jun. 1977, pp. 746-750.

"Radar Signal Processing-Digital, Charge-Coupled Device (CCD), or Surface Acoustic Wave (SAW)?", Jerome Margolin & Paul C. McHugh, SPIE vol. 180 Real-Time Signal Processing II (1979), pp. 230-241.

Primary Examiner—Joseph F. Ruggiero
Attorney, Agent, or Firm—Arthur A. Smith, Jr.; Thomas J. Engellenner

[57] ABSTRACT

A charge domain digital-analog multiplier device. The device has one analog input, M-parallel digital inputs, and one analog output. An M-bit digital word signal is applied to the digital inputs and an analog signal is applied to the analog input. The output is a charge packet which is proportional to the product of the analog input signal and the digital word.

30 Claims, 9 Drawing Figures

CHARGE DOMAIN MULTIPLYING DEVICE

The Government has rights in this invention pursuant to Contract Number AF19(628)-80-C-0002 awarded by the U.S. Department of the Air Force.

REFERENCE TO RELATED APPLICATION

The subject matter of this application is related to that of U.S. patent application Ser. No. 300,219, entitled "Charge Domain Parallel Processing Network", A. M. Chiang, filed on even date herewith.

BACKGROUND OF THE INVENTION

The present invention is in the field of integrated circuit devices and more particularly is directed to digital-analog multipliers.

In the prior art, multiplier circuits have generally been provided by signal transformations in the current domain, i.e. by controlling sums of weighted current signals.

In one form, multiplying digital-to-analog converter devices have been produced using bucket brigade devices (BBD's). These converter devices generally utilize a set of binary-weighted capacitors which have an analog signal impressed across them. MOS transistors drive currents into and out of selected ones of the set of capacitors. Control of the particular ones of the set of capacitors which are so driven, is established by gates which are controlled by a digital word signal (which may be user-controlled for a variable multiplier, or may be preset for a fixed weight multiplier). The charging or discharging currents for the capacitors are summed and serve to launch a charge packet in a BBD. While that resultant charge packet in the BBD is proportional to the product of a digital word (which controls the gates to the respective capacitors) and an analog voltage applied to those capacitors, the generation of this charge packet is relatively slow, principally due to the long time constant associated with the MOS transistors used in the charging of the capacitors.

It is an object of the present invention to provide an improved digital-analog multiplier.

Another object is to provide an improved multiplying digital-to-analog converter (MDAC).

It is another object to provide an MDAC which is characterized by the relatively high speed and relatively low power operation.

SUMMARY OF THE INVENTION

Briefly, the present invention is a charge domain digital-analog multiplying apparatus. In one form of the invention, the apparatus is a multiplying digital-to-analog converter in which an input analog signal is multiplied by a desired, i.e. variable, digital word to provide an output analog signal. In another form of the invention, the multiplication may be performed with a fixed value digital word.

The invention includes a plurality of charge coupled devices (CCD's), one or more input portions and a charge summing portion. Each CCD device may be a separate structure, or may be a separate channel, or cell, within a single structure. Each of the input portions is associated with and coupled to one of the CCD's. The respective input portions are each characterized by a predetermined weight and are each adapted to selectively establish a charge packet in its associated CCD, where the charge packet has a magnitude proportional to the product of the weight associated with that input portion and the difference between an analog input potential V and a reference potential $0_{ref}$. The reference potential may be a composite potential proportional to the sum of an externally applied potential and internal potentials, such as threshold potentials (due to trapping centers, fixed charge in the oxide layers, doping and the like), and other internal potentials (which may be related factors like substrate doping and oxide thickness). Conventional techniques may be used to transfer the charge packet once it is established in the CCD.

In one form of the invention, the input portion includes at least two condutive elements, or electrodes, overlying the CCD, where at least one of these electrodes has an effective capacitance proportional to the characteristic weight of that input portion. In the preferred form, the electrodes are binary-weighted.

The charge summer is coupled to each of the plurality of CCD's. The charge summer is adapted to generate an output signal representative of the sum of the charge packets in the CCD's.

In the variable weight multiplier form of the invention, each CCD may have a binary control gate which controls a charge injector for that CCD. The control gates are selectively operative in a first binary state to prevent establishing a charge packet in their associated CCD's, and are selectively operative in a second binary state to permit establishing of a charge packet in the respective CCD's.

In operation, various ones of the control gates are operative in their second binary state while the others are operative in their first binary state to enable a loading of charge packets by way of the charge injectors in the respective CCD's associated with the control gates in their second binary state. The magnitudes of the charge packets loaded in these CCD's are proportional to the product of the capacitance of the respective weighted electrodes and the difference between an analog voltage and a reference potential. As a result, a charge packet is established in the $i^{th}$ CCD which varies with $C_i a_i (V_i - \phi_i)$, where $C_i$ is the capacitance of the input gate electrode associated with the $i^{th}$ CCD, $a_i$ is the binary value representative of the binary state of the control gate associated with the $i^{th}$ CCD, and $V_i$ and $\phi_i$ are the respective input and reference potentials applied to the respective electrodes of the input portions of the $i^{th}$ CCD.

In the fixed weight multiplying form of the invention, a fixed digital word controls the establishment of charge packets in the CCD's. In this form, control charge injectors ae established in CCD's corresponding to all bits of the digital word represented by one binary value (such as binary 1) in the digital word. As a result, the magnitude of the charge packet established in the $i^{th}$ CCD varies with $C_i(V_i - \phi_i)$. The charge summer provides a signal representative of the sum of all these charge packets.

BRIEF DESCRIPTION OF THE DRAWINGS

The foregoing and other objects of this invention, the various features thereof, as well as the invention itself, may be more fully understood from the following description, when read together with the accompanying drawings in which.

DESCRIPTION OF THE PREFERRED EMBODIMENT

Two preferred forms of the charge domain multiplying devices of the present invention are described here. The first is a "fixed-weight" digital-analog multiplier where the digital word is predetermined (for example, at the mask-making stage). In this form, an analog sampled-data is always multiplied by the same digital word, and the output of the fixed-weight multiplier is a charge packet which is always proportional to the analog input by the same factor. No digital input is needed for a fixed-weight multiplier (i.e., it only has one analog input and one analog output).

The second form of the charge domain multiplying device is a multiplying digital-to-analog converter (MDAC). Each MDAC with M-bit accuracy has one analog input, M-parallel digital inputs, and one analog output. The digital word for the MDAC is electrically programmable (for example, by the user). The output of the MDAC is a charge packet which is proportional to the product of the analog input and the digital word.

The details of the exemplary fixed-weight multiplier and a MDAC are described below.

FIXED WEIGHT DIGITAL-ANALOG MULTIPLIER

Figure 1:
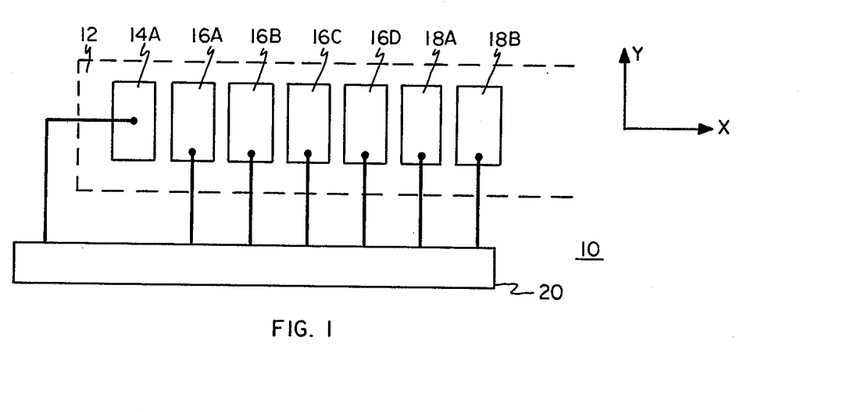
FIG. 1 shows a top view of an exemplary digital-analog multiplier in accordance with the present invention.

A CCD fixed-weight digital-analog multiplier 10 is shown schematically in FIG. 1. Multiplier 10 includes a CCD cell 12. Cell 12 has an associated input diode 14 coupled between an input electrode 14A and cell 12 for injecting charge into cell 12. Cell 12 underlies one or more charge packet control electrodes (FIG. 1 shows an embodiment having four charge packet control electrodes 16A, 16B, 16C and 16D) and two transfer control electrode 18A and 18B. A controller 20 is coupled to all electrodes to apply appropriate voltages to control the operation of multiplier 10.

FIGS. 2–5 show cross-section electric potential diagrams for different embodiments of the invention. The cross-sections are along the axis X of FIG. 1. In all of these embodiments, voltages $V_{G\phi H}$ and $V_{G\phi L}$ respectively applied to the transfer control electrodes 18A and 18B establish a pair of offset potential levels in the CCD (where the level established by $V_{G\phi H}$ is higher than the level established by $V_{G\phi L}$). In the present embodiments, the voltages $V_{G\phi H}$ and $V_{G\phi L}$ are synchronous two-phase signals which result in a pair of offset potential levels in the CCD portions of the CCD cell underlying those electrodes where the levels are shifted up and down together in synchronism with the clock signal for the CCD. In some embodiments, separate voltages may be applied to electrodes 18A and 18B. Alternatively, the offset potentials may be built into the CCD (e.g. by ion implantation techniques) and those electrodes 18A and 18B may be connected together and be driven by a single two-phase signal. In other embodiments, other multi-phase signals may be used.

Figure 2:
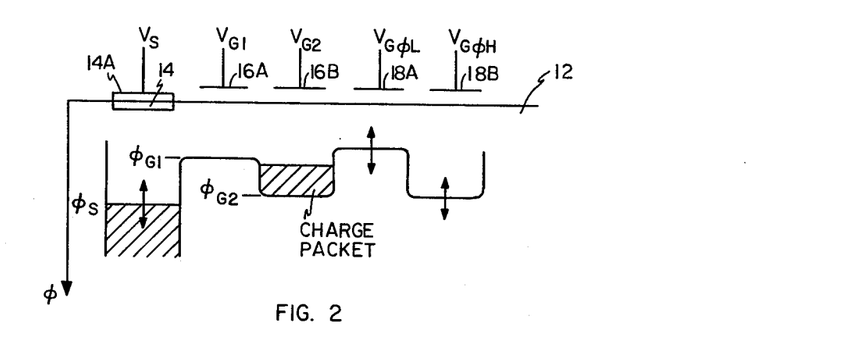
FIGS. 2–5 show electric potential diagrams of exemplary embodiments of the invention.

FIG. 2 shows a "fill and spill" configuration including diode 14, input electrode 14A packet control electrodes 16A and 16B and transfer control electrodes 18A and 18B. In the preferred form, the width of the electrode 16B (in the direction of axis Y of FIG. 1) is selected to achieve a desired capacitance. The area of the electrode 16B equals $WA_{min}$, where $A_{min}$ is a process-determined minimum gate area and W is a value representative of a desired fixed multiplier. The capacitance C associated with the input gate equals $WA_{min}C_o$ where W is the desired weighting factor and $C_o$ is the input gate capacitance per unit area.

In this embodiment, fixed voltages $V_{G1}$ and $V_{G2}$ applied to electrodes 16A and 16B may establish a pair of offset potential levels, $\phi_{G1}$ and $\phi_{G2}$, as shown in FIG. 2.

In response to an applied voltage $V_s$, the diode 14 normally establishes a potential level ($\phi_s$ in FIG. 2) in the CCD which is greater than that established by $V_{G1}$ on electrode 16A. To establish a charge packet in CCD 12, while $V_{G\phi L}$ and $V_{G\phi H}$ are in their low potential phase, the diode 14 is pulsed to temporarily lower the potential it establishes in CCD 12 to a level below that established by $V_{G1}$. As a result, a charge packet is established in the potential well underlying electrode 16B. An exemplary charge packet is indicated by the cross-hatched portion under electrode 16B in FIG. 2. The magnitude of the charge packet is proportional to $C((V_{G2}-V_{T2})-(V_{G1}-V_{T1}))$ where $V_{T1}$ and $V_{T2}$ are threshold voltages associated with electrodes 16A and 16B respectively and C is the capacitance of electrode 16B. The charge packet is then transferred out of that well as $V_{G\phi L}$ and $V_{G\phi H}$ switch first to their high phase and then to their low phase. In operation, when an analog input potential V is applied to electrode 16B, the amount of charge transferred into the cell 12 is proportional to $C(V-\phi_{ref})$, where V corresponds to $V_{G2}$ and $\phi_{ref}$ is the "reference potential" associated with electrode 16A (including the voltage $V_{G1}$ applied to electrode 16A and the threshold voltages $V_{T1}$ and $V_{T2}$). In alternate embodiments, the analog input voltage V may be applied to electrode 16A and the reference voltage is associated with the electrode 16B. Again, the amount of charge transferred into cell 12 is proportional to $C(V-\phi_{ref})$.

If V is a time-varying function, or a sequence of values, $V_n$, the sequence of output data from this multiplier (in the form of charge packets transferred by electrodes 18A and 18B from cell 12) is a corresponding sequence of values proportional to $C(V_n-\phi_{ref})$. Thus, the output of the fixed-weight multiplier 10 varies with the analog input by the scaling factor W.

Figure 3:
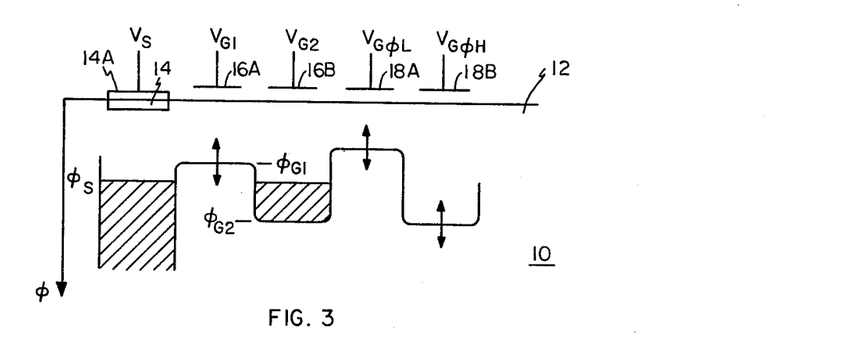

FIG. 3 shows another embodiment which is similar to that of FIG. 2, and wherein the multiplier 10 includes diode 14, input electrode 14A, packet control electrodes 16A and 16B and transfer electrodes 18A and 18B. In FIG. 3, the electrode 16B has a predetermined area, and thus is characterized by a desired capacitance C. The analog input voltage V is applied either to diode 14 or electrode 16B (to establish potential levels $\phi_s$ or $\phi_{G2}$) while the other of those elements is maintained fixed. In operation, the electrode 16A normally maintains a relatively low potential $\phi_{G1}$ (as shown in FIG. 3) in cell 12. To establish a charge packet, the electrode 16A is pulsed to temporarily raise the potential $\phi_{G1}$ above $\phi_{G2}$ so that charge can flow from the diode 14 to the potential well underlying electrode 16B. The resultant charge packet in this well is proportional to $C(V-\phi_{ref})$, when V corresponds to the analog voltage applied to diode 14 (by way of electrode 14A) or electrode 16B and $\phi_{ref}$ corresponds to the potential (including the offset potential) associated with the other of these elements. Otherwise, operation of the device of FIG. 3 is similar to that of FIG. 2.

Figure 4:
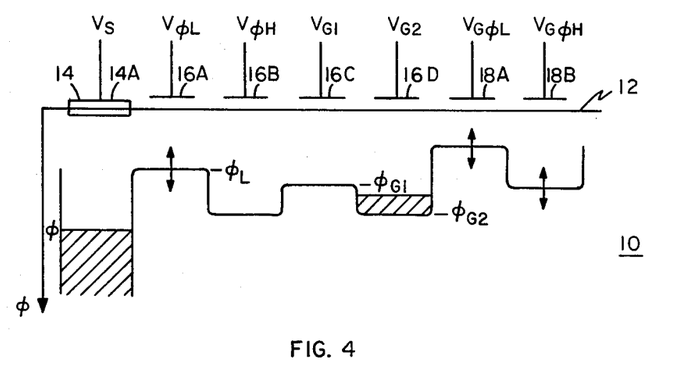

FIG. 4 shows another embodiment wherein the multiplier 10 includes diode 14, input electrode 14A packet control electrodes 16A, 16B, 16C and 16D and transfer electrodes 18A and 18B. In the configuration of FIG. 3, the electrode 16B has a predetermined area and thus is characterized by a desired capacitance C. In operation, the diode 14 is driven to establish a fixed potential $\phi_S$ and electrodes 16C and are driven to establish fixed potential $\phi_{G1}$ and $\phi_{G2}$. Electrode 16D is driven so that $\phi_{G2}$ is greater than $\phi_{G1}$. The electrodes 16A and 16B are synchronously driven by a two-phase signal that maintains $\phi_L$ less than $\phi_H$ and so that the potential $\phi_L$ is alternately above $\phi_s$ and below $\phi_{G1}$. As a result, during each cycle, the potential well underlying electrode 16B is filled with a charge packet $Q_o$ which is generally proportional to $C$ $(\phi_L - \phi_H)$. During the portion of the cycle when $\phi_L$ and $\phi_H$ are in their low states, a portion of that $Q_o$ charge packet is dumped into the potential well underlying electrode 16D. Generally, the charge packet underlying electrode 16D is proportional to $-Q_o + C(V_{G1} - \phi_{ref})$. In operation, the analog input V is applied to electrode 16C while the potential established by electrode 16B contributes to the "reference potential." Thus, the charge packet varies with $C(V-\phi_{ref})$, where V corresponds to the voltage applied to electrode 16C.

Figure 5:
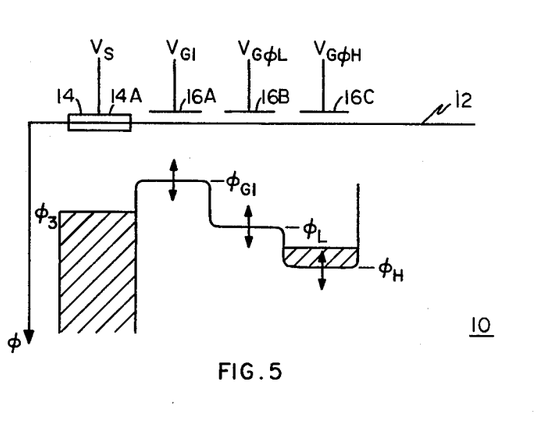

FIG. 5 shows an embodiment which is suitable for dynamic injection. The multiplier 10 includes a diode 14, input electrode 14A and packet control electrodes 16A, 16B and 16C. In the configuration of FIG. 5, the electrode 16A has a predetermined width-to-length ratio (W/L), where L is measured in the direction of charge flow and W is measured in the direction perpendicular thereto. In operation, in this embodiment, the electrodes 16B and 16C are driven to maintain a constant potential offset. These electrodes are driven with a two phase signal so that they can also serve as transfer electrodes.

In operation, either the electrode 16A is driven to establish a fixed potential $\phi_{G1}$ (below $\phi_L$) while the diode 14 is pulsed for a desired time to lower the potential it establishes to a desired point (below $\phi_{G1}$), or the diode 14 is driven (by way of electrode 14A) to establish a fixed potential $\phi_S$ (below $\phi_L$) and the electrode 16A pulsed for a desired time to raise the potential it established to a desired point above $\phi_S$. The magnitude of the charge packet established in the potential well underlying electrode 16C is proportional to the integral (over the duration of the pulse) of the current produced by the pulse, where the current is proportional to $(W/L)$ $(V_{G1}-V_{T1}-V_s)^2$, where $V_{T1}$ is an offset associated with electrode 16A. Thus, the charge packet varies with $(W/L)$ $(V-\phi_{ref})^2$ where V corresponds to the analog input voltage applied to electrode 16A or electrode 14A, and $\phi_{ref}$ corresponds to the potential (including the offset potential) associated with the other of these electrodes.

Figure 6:
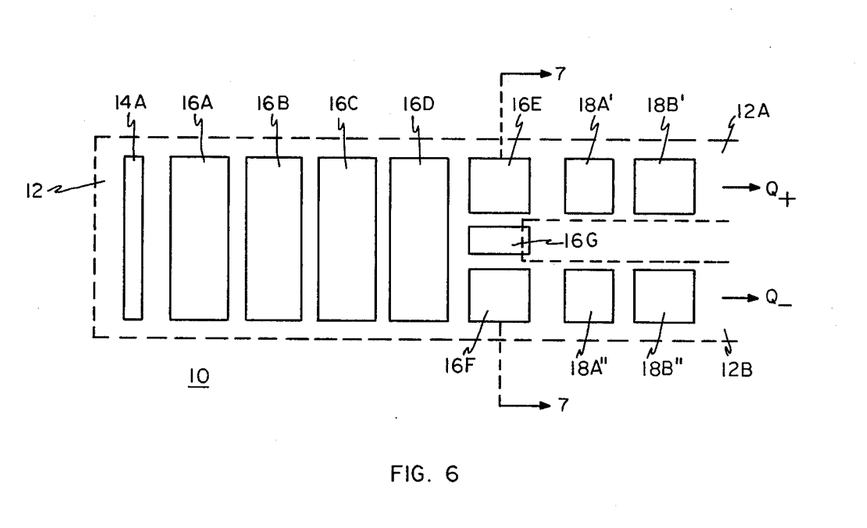
FIG. 6 shows a top view of another embodiment of the invention.

FIG. 6 shows at top view of yet another embodiment of the present invention which is well suited for use as a fixed weight multiplier, particularly since that embodiment eliminates one-way potential offset effects.

Figure 7:
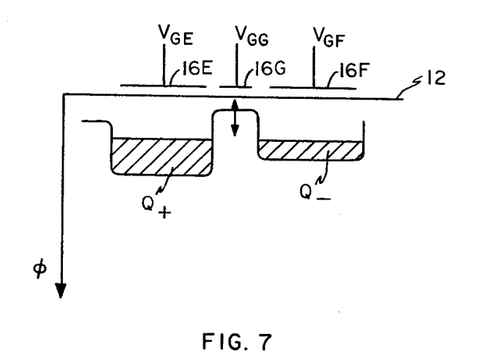
FIG. 7 shows an electric potential diagram of the embodiment of FIG. 6.

The multiplier 10 includes a diode 14, input electrode 14A, packet control electrodes 16A, 16B, 16C, 16D, 16E, 16F and 16G, and transfer electrodes 18A', 18B', 18A" and 18B". The electrodes 16E and 16F have the same predetermined area, and thus, each is characterized by a desired capacitance C. FIG. 7 shows a cross-section potential diagram for multiplier 10 along lines 7—7 of FIG. 6.

In operation, during each clock cycle of CCD 12, the voltages applied to diode 14 and electrodes 16A and 16B establish a charge packet $Q_o$ in cell 12. Two-phase signals applied to the electrodes 16C and 16D transfer that charge packet to potential wells underlying electrodes 16E and 16F while electrode 16G has an applied voltage which establishes a relatively high potential. Then the voltage $V_{GG}$ applied to electrode 16G is switched to establish a relatively low potential (as shown in FIG. 7) between the potential wells underlying the electrodes 16E and 16F. This potential barrier splits the $Q_o$ charge packet into $Q_+$ (underlying electrode 16E) and $Q_-$ (underlying electrode 16F), where $Q_+$ is proportional to $C(V_+ - V_-)+(\frac{1}{2})Q_o$ and $Q_{31}$ is proportional to $C(V_- - V_+)+(\frac{1}{2})Q_o$, and where either $V_+$ or $V_-$ is an analog voltage and the other is a reference potential. Thus, each of these charge packets varies with $C$ $(V-\phi_{ref})$ where V can be either $V_+$ or $V_-$.

The two-phase CCD clock signal is then applied to electrode pairs 18A', 18B' and 18A', 18B" to transfer the charge packets in those respective wells into channels 12A and 12B of the CCD cell 12.

In various embodiments, such as those described in conjunction with FIGS. 2-7, fixed weight multipliers may be coupled in parallel by a charge summer device which provides an output signal which is proportional to the sum of the charge packets transferred out of the CCD cells. In one form, the charge summing device may be a single CCD cell which is coupled to the multiplier CCD cells and adapted to generate a composite charge packet from the charge packets transferred from the individual multiplier CCD cells. In another form, the charge summer may include a plurality of floating gate sensor electrodes (one for each CCD) overlying the CCD's and a voltage-summing device adapted to sum the voltages of the various sensor electrodes.

In the form having a plurality of multipliers, the composite multiplier may be mask programmed so that one or more of the CCD cells may permit injection of charge packets while the other cells may not. In this case, a fixed digital word in effect controls the multiplication of the input analog signal.

MULTIPLYING DIGITAL-TO-ANALOG CONVERTER

Each of the multipliers described in conjunction with FIGS. 2-7 may be controlled by a binary controller which permits the multiplier to be selectively operative. By way of example, in all of those examples, an additional electrode overlying cell 12 may be positioned between the diode 14 and electrode 16A. The potential underlying this additional electrode may be selectively controlled to be below all other potentials in the device (to prevent establishment of a charge packet) or above all other potentials in the device (to permit establishment of a charge packet). As a result, the multiplier is a variable (or programmable) weight multiplier.

Figure 8:
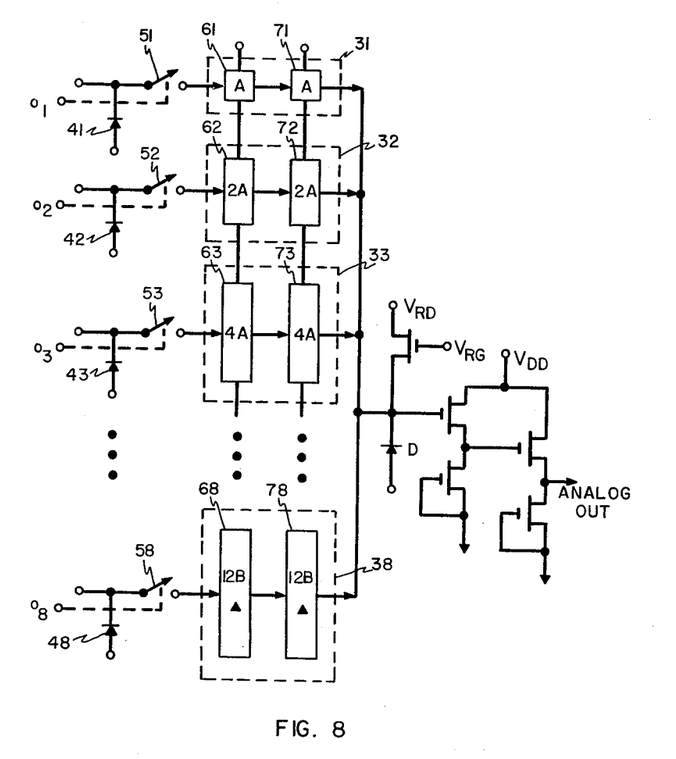
FIG. 8 shows an exemplary multiplying digital-to-analog converter (MDAC) in accordance with the present invention.

An 8-bit CCD multiplying digital-to-analog converter (MDAC) 20 is shown in FIG. 8. Converter 20 is a multiple input CCD structure. Converter 20 includes eight CCD cells 31-38, adapted for the "fill and spill"

charge injection. Each cell is coupled to an associated one of input diodes 41-48 (corresponding to diode 14 in FIG. 2) and charge injection control gates 51-58, reference potential gates 61-68 (corresponding to electrode 16A in FIG. 2) and input gate electrodes 71-78 (corresponding to electrode 16B in FIG. 2). In this exemplary configuration, the diode D in FIG. 8 acts as a charge summer for the charge in the wells underlying each of electrodes 71-78. Consequently, no charge transfer electrodes (which might correspond to electrodes 18A and 18B in FIG. 2) are necessary.

In operation, the logic levels denoted by the various bits of an applied digital word signal $a_1 a_2 a_3 \ldots a_8$ control the states of gates 51-58. When one of these gates 51-58 is in its conductive state, a charge packet may be injected into its associated CCD cell. When one of gates 51-58 is in its non-conductive state, no charge packet may be injected into its associated cell. Thus, the logic levels (represented by signals $a_1, a_2, \ldots a_8$ in FIG. 2) control the potential of the input diodes and thereby perform a multiplication of the charge flow to the input gates by 0 or 1.

Figure 9:
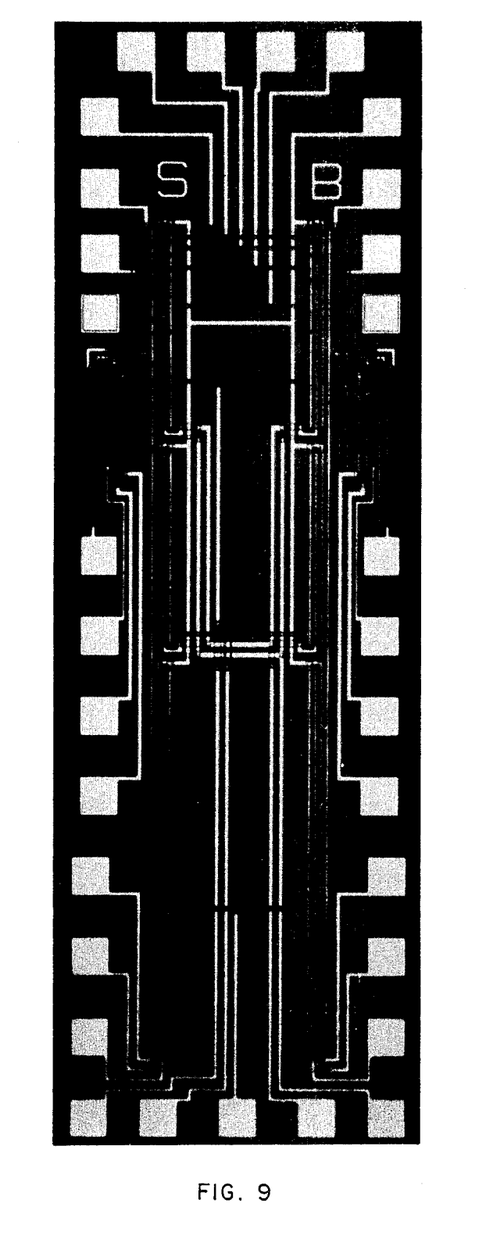
FIG. 9 shows a photomicrograph of an integrated circuit including two MDAC's in the form of that shown in FIG. 8.

Each of cells 31-38 underlie an associated one of reference potential electrodes 61-68 and input gate electrodes 71-78. The area of the input gate and reference potential gate corresponding to the ith bit are proportional to $2^{i-1}$. As a result, the quantity of charge, $Q_i$ injected into the $i^{th}$ cell is proportional to the product of the value of bit $a_i$, the gate area $A_i$ and the difference between the analog signal ($V_i$) applied to that input gate and the reference potential ($\phi_i$) applied to the reference potential gate. Thus, $Q_i$ varies with $2^{i-1} C_{min} a_i (V_i - \phi_i)$, where $C_{min}$ is the effective capacitance of the least significant bit (LSB) input gate. The output of the eight parallel CCD cells 31-38 are summed in the charge domain (in region 80), and the analog output is detected by floating diffusion output circuitry and an on-chip two-stage source follower. FIG. 9 shows a photomicrograph of an integrated circuit chip having two 8-bit MDAC's in the general form of FIG. 10.

The MDAC embodiment of FIG. 8 is suitable for multiplication of an analog signal by a digital signal representative of a digital number of one polarity. In order to provide four-quadrant multiplication, i.e. where the digital signal may represent either a positive or negative number, the configuration of FIG. 8 may be modified so that electrode 78 is coupled to $\phi_1$ (and to electrodes 61-67) and electrode 68 is coupled to $V_{in}$ (and electrodes 71-77). With this configuration, the charge packets for the most significant bit (MSB) CCD has a magnitude $C_8(\phi_1 - V_{in})$, where $C_8$ is the capacitance of electrode 78. The charge packets for the other CCD's have magnitudes $C_j(V_{in} - \phi_1)$, respectively, where j is an index value from 1 to 7 corresponding to the various CCD's. Thus, the charge packet of the MSB cell is the complement of that produced by the FIG. 8 (unmodified) configuration. Since in 2's complement digital notation, the MSB determines the sign (i.e. polarity) of the digital word, and the MDAC of FIG. 8, as modified to provide a complementary MSB charge packet, permits four-quadrant multiplication of digital and analog signals.

In addition to the "fill and spill" configuration (of FIG. 2), a four-quadrant MDAC may be provided by a plurality of devices having the form of FIG. 3 or FIG. 6 which are coupled together by a charge summer. In the latter configurations, the MSB CCD is connected to provide a charge packet which is complementary to the packets produced by the other channels.

For example, for devices where the multiplier for each bit has the form of that in FIG. 3, the MSB multiplier might have the analog input voltage connected to electrode 14A and the reference potential is associated with electrode 16B, while the other multipliers have the analog input voltage connected to electrode 16B and the reference potential associated with electrode 14A.

Where the multiplier for each bit has the form of that in FIG. 6, the MSB multiplier might have the analog input voltage connected to electrode 16E and the reference potential associated with electrode 16F, while the other multipliers have the analog input voltage connected to electrode 16F and the reference potential associated with electrode 16E.

As an alternative, where the charge summer is a type which provides voltages representative of the charge packets in the respective CCD's, an MDAC may be constructed from a plurality of FIG. 2 or FIG. 3 type devices without providing for complementary charge packes. In these configurations, the resultant voltages for the CCD's are summed by a voltage summing device which inverts the MSB voltage signal before summing it with the other non-inverted voltage signals.

In the above-described MDAC configurations, the charge packet for the $i^{th}$ CCD includes an "offset term" $a_i C_i \phi_i$ which is dependent upon the value of $a_i$. As a result, the MDAC output is dependent in part upon the particular values of the digital signals. In order to eliminate this dependency, an MDAC may have two identical structures, for example, each in the form shown in FIG. 8. In this configuration, the analog input voltage is applied to the $V_{in}$ terminal of the first one of the structures, while the $V_{in}$ terminal for the other structure is maintained at zero potential. The gates 51-58 of the first structure are controlled by the values of $a_1, \ldots a_8$ while the corresponding gates of the other structure are controlled by the respective binary complements of the values of $a_1, \ldots a_8$. As a result, the $i^{th}$ pair channels produces charge packets having magnitudes proportional to $C_i a_i (V_{in} - \phi_i)$ and $-C_i \bar{a}_i \phi_i$. The sum of these (provided by the charge summer) is $C_i a_i V_{in} + C_i \phi_i (a_i + \bar{a}_i)$ or $C_i a_i V_{in} + C_i \phi_i$, where the "offset term" $C_i \phi_i$ is independent of $a_i$.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the maintaining and range of equivalency of the claims are therefore intended to be embraced therein.

We claim:

1. A charge domain multiplying device comprising:
   A. a first set of one or more charge coupled devices (CCD's),
   B. a first set of one or more input means, each of said input means being associated with and coupled to one of said CCD's and characterized by a predetermined weight, and including means for selectively establishing a charge packet in the CCD associated with said input means, said charge packet having a magnitude varying with the product of said predetermined weight and the difference between an input potential V and a reference potential, $\phi_{ref}$, C. a set of one or more charge injection means, each injection means being coupled between an associated input electrode and the associated CCD, wherein each of said input means further includes at least two adjacent conductive electrodes overlying its associated CCD, wherein the first of said adjacent electrodes for each CCD has a characteristic capacitance proportional to the predetermined weight of that input means, and the second of said adjacent electrodes is between said first electrode and said injection means; and D. charge summing means for generating an output signal representative of the sum of the charge packets in said CCD's.

2. A device according to claim 1 wherein each charge injection means further comprises an associated binary control gate, said control gate being selectively operative in a first binary state to prevent said establishing of a charge packet in its associated CCD, and being selectively operative in a second binary state to permit said establishing of a charge packet in its associated CCD.

3. A device according to claim 1 wherein each input means further comprises means for maintaining said second electrode at a fixed potential below the potential of said first electrode and means for selectively pulsing the potential of said input electrode below that of said second electrode, whereby said charge packets may be selectively established in the respective ones of said CCD's, wherein the magnitude of the charge packet for the $i^{th}$ CCD is proportional to:

$$C_i a_i(V_i - \phi_i)$$

where $C_i$ is the capacitance of said first electrode of the input means of the $i^{th}$ CCD, $a_i$ is a binary value representative of the binary state of the control gate associated with the $i^{th}$ CCD, and $V_i$ is the input potential applied to said first electrode and $\phi_i$ is the reference potential associated with said second electrode.

4. A device according to claim 1 wherein each input means further comprises means for maintaining said first electrode at a fixed potential above the potential of said second electrode and means for selectively pulsing the potential of said input electrode below that of said second electrode, whereby said charge packets may be selectively established in the respective ones of said CCD's, wherein the magnitude of the charge packet for the $i^{th}$ CCD is proportional to:

$$C_i a_i(V_i - \phi_i)$$

where $C_i$ is the capacitance of said first electrode of the input means of the $i^{th}$ CCD, $a_i$ is a binary value representative of the binary state of the control gate associated with the $i^{th}$ CCD, and $V_i$ is the input potential applied to said second electrode and $\phi_i$ is the reference potential associated with said first electrode.

5. A device according to claim 1 wherein each input means further comprises means for maintaining said input electrode at a fixed potential below the potential of said first electrode and means for selectively pulsing the potential of said second electrode above that of said first electrode whereby said charge packets may be selectively established in the respective ones of said CCD's, wherein the magnitude of the charge packet for the $i^{th}$ is proportional to:

$$C_i a_i(V_i - \phi_i)$$

where $C_i$ is the capacitance of said first electrode of the input means of the $i^{th}$ CCD, $a_i$ is a binary value representative of the binary state of the control gate associated with the $i^{th}$ CCD, and $V_i$ is the input potential applied to said first electrode and $\phi_i$ is the reference potential associated with said input electrode.

6. A device according to claim 1 wherein each input means further comprises means for maintaining said first electrode at a fixed potential above the potential of said input electrode and means for selectively pulsing the potential of said second electrode above that of said input electrode, whereby said charge packets may be selectively established in the respective ones of said CCD's, wherein the magnitude of the charge packet for the $i^{th}$ CCD is proportional to:

$$C_i a_i(V_i - \phi_i)$$

where $C_i$ is the capacitance of said first electrode of the input means of the $i^{th}$ CCD, $a_i$ is a binary value representative of the binary state of the control gate associated with the $i^{th}$ CCD, and $V_i$ is the input potential applied to said input electrode and $\phi_i$ is the reference potential associated with said first electrode.

7. A device according to claim 1 wherein each input means further comprises third and fourth electrodes overlying its associated CCD adjacent to and successively farther from said injection means than said first and second electrode, and means for maintaining said input electrode at a fixed potential above that of said third electrode and means for maintaining said third and fourth electrodes at fixed potentials with the potential of said fourth electrode being higher than that of said third electrode, and means for maintaining the potential of said second electrode lower than that of said first electrode, and means for selectively pulsing said first and second electrodes synchronously whereby the potential of said second electrode passes from a potential below that of said input electrode to a potential above that of said input electrode and back to a potential below that of said input electrode, whereby said charge packets may be selectively established in the respective ones of said CCD's wherein the magnitude of the charge packet for the $i^{th}$ CCD is proportioned to:

$$-Q_o + C(V_i - \phi_i)$$

where $C_i$ is the capacitance of said first electrode at the input means of the $i^{th}$ CCD, $a_i$ is a binary value representative of the binary state of the control gate associated with the $i^{th}$ CCD, $Q_o$ is proportional to the product of $C_i$ and the difference in the potentials associated with said first and second electrodes, $V_i$ is the input potential applied to the third electrode and $O_i$ is the reference potential associated with the first and third electrodes.

8. A device according to claim 1 wherein each CCD includes an input region, two output regions, and an intermediate region coupling said input region to each of said output regions, each CCD has an associated input means, each of said input means including a charge injection means and including an associated binary control gate, said control gate being selectively operative in a first binary state to prevent said establishing of a charge packet in its associated CCD, and being selectively operative in a second binary state to permit said establishing of a reference charge packet having a predetermined magnitude $Q_o$ in the input region of its associated CCD, and wherein said input means includes means for electrodes transferring said reference charge packet to said intermediate region, and further includes three conductive electrodes overlying said intermediate region, the first of said electrodes overlying a first portion of said intermediate region coupling said input region and a first of said output regions, the second of said electrodes overlying a second portion of said intermediate region coupling said input region and the second of said output regions and the third of said electrodes overlying a third portion of said intermediate region separating said first and second portions of said intermediate region, said first and second electrodes having a characteristic capacitance proportional to the predetermined weight of that input means, and said third electrode having a relatively small capacitance compared to that of said first and second electrodes, and wherein said input means further includes means for selectively pulsing said third electrode from a potential above the potentials of said first and second electrodes to a potential below the potentials of said first and second electrodes and back to a potential above the potential of said first and second electrodes, thereby establishing a charge packet in said first output region having a magnitude proportioned to $$(\tfrac{1}{2})Q_oC(V_+ - V_-)$$

and establishing a charge packet in said second output region having a magnitude proportioned to $$(\tfrac{1}{2})Q_o + C(V_- - V_+)$$

where $V_+$ is the input potential applied to one of said first or second electrodes and $V_-$ is the reference potential associated with the other of said first or second electrodes.

9. A device according to claim 1
wherein each CCD having an associated input means includes an input region, two output regions and an intermediate region coupling said input region to each of said output regions, and said input means includes a charge injection means operative to permit the establishment of a reference charge packet having a predetermined magnitude $Q_o$ in the input region of its associated CCD, and wherein said input means includes means for selectively transferring said reference charge packet to said intermediate region, and further includes three conductive electrodes overlying said intermediate region, the first of said electrodes overlying a first portion of said intermediate region coupling said input region and a first of said output regions, the second of said electrodes overlying a second portion of said intermediate region coupling said input region and the second of said output regions and the third of said electrodes overlying a third portion of said intermediate region separating said first and second portions of said intermediate region, said first and second electrodes having a characteristic capacitance proportional to the predetermined weight of that input means, and said third electrode having a relatively small capacitance compared to that of said first and second electrodes, and wherein said input means further includes means for selectively pulsing said third electrode from a potential above the potential of said first and second electrodes to a potential below the potentials of said first and second electrodes and back to a potential above the potential of said first and second electrodes, thereby establishing a charge packet in said first output region having a magnitude proportioned to $$(\tfrac{1}{2})Q_o + C(V_+ - V_-)$$

and establishing a charge packet in said second output region having a magnitude proportioned to $$(\tfrac{1}{2})Q_o + C(V_- - V_+)$$

where $V_+$ is the input potential applied to one of said first or second electrodes and $V_-$ is the reference potential associated with the other of said first or second electrodes.

10. A charge domain multiplying device comprising:
A. a first set of one or more charge coupled devices (CCD's),
B. a first set of one or more input means, each of said input means being associated with and coupled to one of said CCD's and characterized by a predetermined weight, and including means for selectively establishing a charge packet in the CCD associated with said input means, said charge packet having a magnitude varying with the product of said predetermined weight and the square of the difference between an input potential V and a reference potential, $\phi_{ref}$,
C. a set of one or more charge injection means, each injection means forming part of said input means and coupled between an associated input electrode and the associated CCD operative to permit said establishment charge packet in its associated CCD, and wherein each input means further includes at least one conductive electrode overlying its associated CCD, wherein the overlying conductive electrode for each CCD has a characteristic weight-to-length ratio proportional to the predetermined weight of that input means, whereby said charge packets may be established in the respective ones of said CCD's having operative charge injection means by applying a voltage pulse to either the input electrode, or the overlying conductive electrode, wherein the magnitude of the charge packet for the $i^{th}$ CCD is proportional to the integral of:

$$(W_i/L_i)(V_i - \phi_i)^2$$

for the duration of said pulse, where $L_i$ is the length of the overlying conductive electrode of the input means of the ith CCD in the direction of charge flow under the overlying conductive electrode, and $W_i$ is the width of the overlying conductive electrode transverse to said direction, and $V_i$ is the input potential associated with one of the input electrode and the overlying conductive electrode and $\phi_i$ is the reference potential associated with the other of the overlying conductive electrode and the input electrode D. charge summing means for generating an output signal representative of the sum of the charge packets in said CCD's.

11. A device according to claim 10 wherein each charge injection means further comprises an associated binary control gate, said control gate being selectively operative in a first binary state to prevent said establishing of a charge packet in its associated CCD, and being selectively operative in a second binary state to permit said establishing of a charge packet in its associated CCD, and whereby said charge packets may be selectively established in the respective ones of said CCD's by applying a voltage pulse to either said input electrode or the overlying conductive electrode, wherein the magnitude of the charge packet for the $i^{th}$ CCD is proportional to the time integral of:

$$(W_i/L_i)a_i(V_i-\phi_i)^2$$

for the duration of said pulse, where $L_i$ is the length of the overlying conductive electrode of the input means of the $i^{th}$ CCD in the direction of charge flow under the overlying conductive electrode, and $W_i$ is the width of the overlying conductive electrode transverse to said direction, $a_i$ is a binary value representative of the binary state of the control gate associated with the $i^{th}$ CCD, and $V_i$ is the input potential associated with one of the input electrode and the overlying conductive electrode, and $\phi_i$ is the reference potential associated with the other of the input electrode and the overlying conductive electrode.

12. A device according to claim 1 or 10 wherein said predetermined weights are proportional to a power of 2.

13. A device according to claim 1 or 10 wherein said charge summing means includes a plurality of floating gate sensing electrodes and a voltage summing device, wherein each of said sensing electrodes is coupled to a respective one of said CCD's and is adapted to generate a voltage representative of the magnitude of the charge packet in that CCD, and wherein said voltage summing device is coupled to said plurality of sensing electrodes and includes means for generating a sum signal representative of the sum of said generated voltages, said sum signal corresponding to said output signal.

14. A device according to claim 1 or 10 wherein said charge summing means includes a means coupled to each of said CCD's for receiving charge packets from said CCD's, whereby the magnitude of the charge in said charge summing means equals the sum of the magnitude of said received charge packets.

15. A device according to claim 14 wherein said means for receiving said charge packets is a CCD.

16. A device according to claim 15 wherein said charge summing means further includes means to generate a voltage signal representative of the magnitude of the charge in said CCD of said charge summing means.

17. A device according to claim 14 wherein said means for receiving said charge packets is a diode.

18. A charge domain multiplying device according to claim 3, further comprising a second set of CCD's and a second set of input means, said second sets including elements substantially similar to the elements of said first sets, and further means for maintaining the respective control gates of the input means of said second set in a binary state complementary to the binary state of the corresponding gate in said first set.

19. A charge domain multiplying device according to claim 4, further comprising a second set of CCD's and a second set of input means, said second sets including elements substantially similar to the elements of said first sets, and further means for maintaining the respective control gates of the input means of said second set in a binary state complementary to the binary state of the corresponding gate in said first set.

20. A charge domain multiplying device according to claim 6, further comprising a second set of CCD's and a second set of input means, said second sets including elements substantially similar to the elements of said first sets, and further means for maintaining the respective control gates of the input means of said second set in a binary state complementary to the binary state of the corresponding gate in said first set.

21. A charge domain multiplying device according to claim 6, further comprising a second set of CCD's and a second set of input means, said second sets including elements substantially similar to the elements of said first sets, and further means for maintaining the respective control gates of the input means of said second set in a binary state complementary to the binary state of the corresponding gate in said first set.

22. A charge domain multiplying device according to claim 7, further comprising a second set of CCD's and a second set of input means, said second sets including elements substantially similar to the elements of said first sets, and further means for maintaining the respective control gates of the input means of said second set in a binary state complementary to the binary state of the corresponding gate in said first set.

23. A charge domain multiplying device according to claim 9, further comprising a second set of CCD's and a second set of input means, said second sets including elements substantially similar to the elements of said first sets, and further means for maintaining the respective control gates of the input means of said second set in a binary state complementary to the binary state of the corresponding gate in said first set.

24. A charge domain multiplying device according to claim 12, further comprising a second set of CCD's and a second set of input means, said second sets including elements substantially similar to the elements of said first sets, and further means for maintaining the respective control gates of the input means of said second set in a binary state complementary to the binary state of the corresponding gate in said first set.

25. A charge domain multiplying device according to claim 4 wherein said predetermined weights of the input means of said first set are successive binary values, wherein for the input means associated with the most-significant bit (MSB) binary value, the input potential $V_{in}$ and the reference potential $\phi_i$ are respectively applied to and associated with the opposite electrodes compared to the input means associated with the other binary values.

26. A charge domain multiplying device according to claim 4 wherein said predetermined weights of the input means of said first set are successive binary values, wherein for the input means associated with the most-significant bit (MSB) binary value, the input potential $V_{in}$ and the reference potential $\phi_i$ are respectively applied to and associated with the opposite electrodes compared to the input means associated with the other binary values.

27. A charge domain multiplying device according to claim 5 wherein said predetermined weights of the input means of said first set are successive binary values, wherein for the input means associated with the most-significant bit (MSB) binary value, the input potential $V_{in}$ and the reference potential $\phi_i$ are respectively applied to and associated with the opposite electrodes compared to the input means associated with the other binary values.

28. A charge domain multiplying device according to claim 6 wherein said predetermined weights of the input means of said first set are successive binary values, wherein for the input means associated with the most-significant bit (MSB) binary value, the input potential $V_{in}$ and the reference potential $\phi_i$ are respectively applied to and associated with the opposite electrodes compared to the input means associated with the other binary values.

29. A charge domain multiplying device according to claim 8 wherein said predetermined weights of the input means of said first set are successive binary values, wherein for the input means associated with the most-significant bit (MSB) binary value, the input potential $V_{in}$ and the reference potential $\phi_i$ are respectively applied to and associated with the opposite electrodes compared to the input means associated with the other binary values.

30. A charge domain multiplying device according to claim 9 wherein said predetermined weights of the input means of said first set are successive binary values, wherein for the input means associated with the most-significant bit (MSB) binary value, the input potential $V_{in}$ and the reference potential $\phi_i$ are respectively applied to and associated with the opposite electrodes compared to the input means associated with the other binary values.

* * * * *